US009824744B1

(12) United States Patent
Finfter

(10) Patent No.: US 9,824,744 B1
(45) Date of Patent: Nov. 21, 2017

(54) HIGH-SPEED DIFFERENTIAL INTERFACE CIRCUIT WITH FAST SETUP TIME

(71) Applicant: Marvell Israel (M.I.S.L) Ltd., Yokneam (IL)

(72) Inventor: Itai Finfter, Kfar-Saba (IL)

(73) Assignee: MARVELL ISRAEL (M.I.S.L) LTD., Yokneam (IL)

(*) Notice: Subject to any disclaimer, the term of this patent is extended or adjusted under 35 U.S.C. 154(b) by 0 days.

(21) Appl. No.: 15/418,785

(22) Filed: Jan. 30, 2017

Related U.S. Application Data

(60) Provisional application No. 62/290,019, filed on Feb. 2, 2016.

(51) Int. Cl.
| | |
|---|---|
| *G11C 7/02* | (2006.01) |
| *G11C 11/4072* | (2006.01) |
| *H03F 3/45* | (2006.01) |
| *G11C 11/4076* | (2006.01) |
| *G11C 11/4091* | (2006.01) |

(52) U.S. Cl.
CPC ...... *G11C 11/4072* (2013.01); *G11C 11/4076* (2013.01); *G11C 11/4091* (2013.01); *H03F 3/45654* (2013.01)

(58) Field of Classification Search
USPC ........................................ 365/207, 206, 205
See application file for complete search history.

(56) References Cited

U.S. PATENT DOCUMENTS

| | | | |
|---|---|---|---|
| 2005/0134380 A1* | 6/2005 | Nairn ................ | H03F 3/4565 330/258 |
| 2005/0200411 A1* | 9/2005 | Chang ................ | H03F 3/45183 330/253 |
| 2016/0344355 A1* | 11/2016 | Siniscalchi ......... | H03F 3/45273 |

OTHER PUBLICATIONS

JEDEC Standard JESD79-4A, "DDR4 SDRAM", Chapter 4 (pp. 32-146), Nov. 2013.

* cited by examiner

*Primary Examiner* — Vu Le

(57) ABSTRACT

A differential interface circuit includes a differential amplifier circuit, a common-mode feedback circuit and a feedback initialization circuit. The differential amplifier circuit is configured to receive and amplify a differential input signal so as to produce an amplified differential output signal. The common-mode feedback circuit is configured to estimate a common-mode level of the differential output signal, to produce a feedback value in response to the estimated common-mode level, and to adjust the differential amplifier circuit using the feedback value. The feedback initialization circuit is configured, in response to detecting that the differential input signal is in a range predefined as abnormal, to temporarily override the common-mode feedback circuit, and instead set the feedback value applied to the differential amplifier circuit to a predefined initialization value.

15 Claims, 3 Drawing Sheets

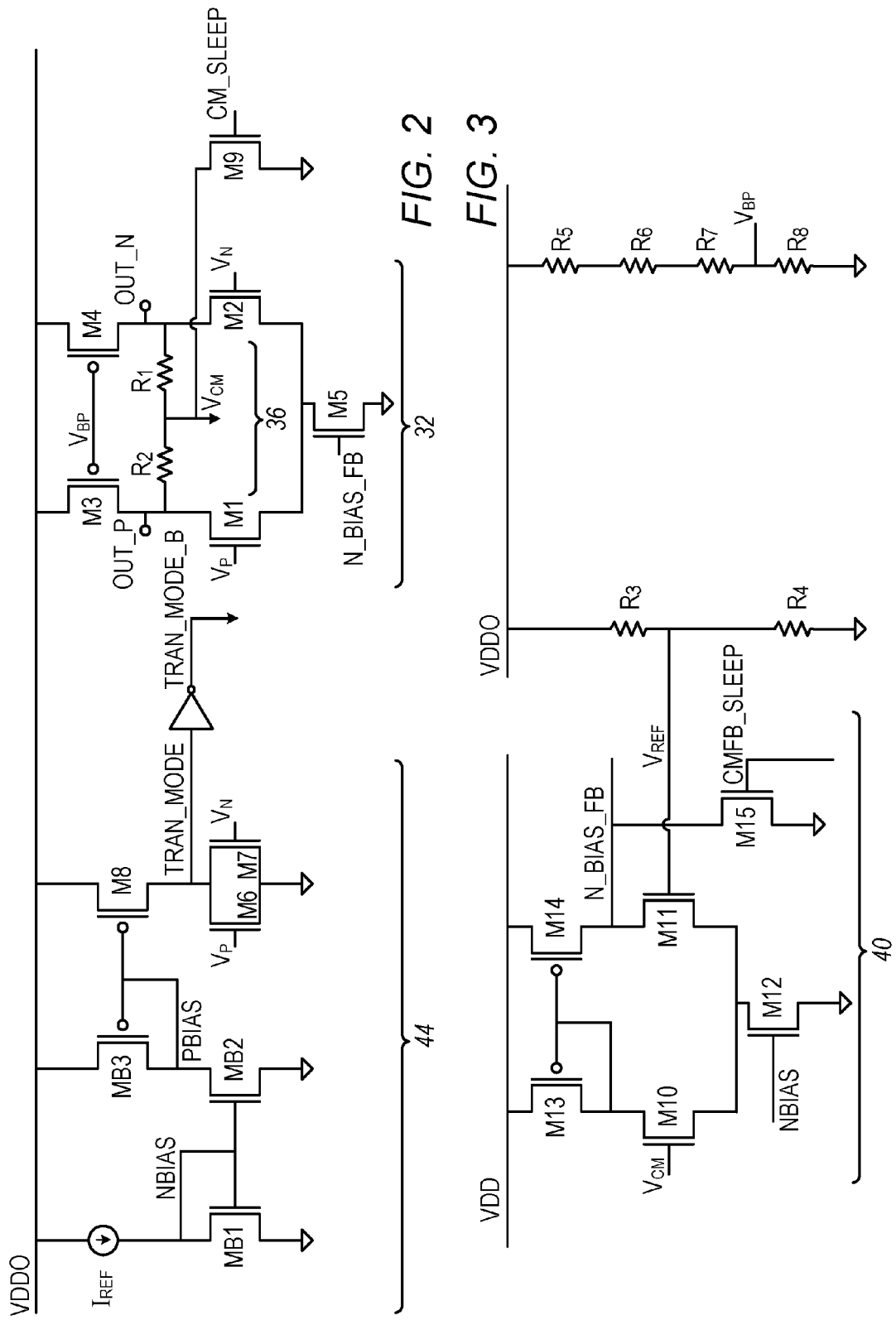

HIGH-SPEED DIFFERENTIAL INTERFACE CIRCUIT WITH FAST SETUP TIME

CROSS-REFERENCE TO RELATED APPLICATIONS

This application claims the benefit of U.S. Provisional Patent Application 62/290,019, filed Feb. 2, 2016, whose disclosure is incorporated herein by reference.

FIELD OF THE DISCLOSURE

The present disclosure relates generally to differential interfaces in electronic circuitry, and particularly to methods and devices for common-mode feedback in differential interfaces.

BACKGROUND

Various kinds of electronic devices use differential signal interfaces. Differential interfaces are used, for example, in Input-Output (I/O) pads of Double Data Rate Synchronous Dynamic Random Access Memory (DDR SDRAM) devices.

The description above is presented as a general overview of related art in this field and should not be construed as an admission that any of the information it contains constitutes prior art against the present patent application.

SUMMARY

An embodiment that is described herein provides a differential interface circuit including a differential amplifier circuit, a common-mode feedback circuit and a feedback initialization circuit. The differential amplifier circuit is configured to receive and amplify a differential input signal so as to produce an amplified differential output signal. The common-mode feedback circuit is configured to estimate a common-mode level of the differential output signal, to produce a feedback value in response to the estimated common-mode level, and to adjust the differential amplifier circuit using the feedback value. The feedback initialization circuit is configured, in response to detecting that the differential input signal is in a range predefined as abnormal, to temporarily override the common-mode feedback circuit, and instead set the feedback value applied to the differential amplifier circuit to a predefined initialization value.

In some embodiments, the feedback initialization circuit is configured to override the common-mode feedback circuit in response to detecting that both sub-signals of the differential input signal are lower than threshold voltages of respective amplification transistors of the differential amplifier circuit. In an embodiment, the feedback initialization circuit includes at least two reference transistors having threshold voltages that match the threshold voltages of the input transistors of the differential amplifier circuit, and the feedback initialization circuit is configured to detect the range predefined as abnormal by comparing the sub-signals of the differential input signal to the threshold voltages of the reference transistors.

In a disclosed embodiment, the feedback initialization circuit is configured to temporarily override the common-mode feedback circuit by setting (i) an estimate of the common-mode level and (ii) the feedback signal to respective initialization values. In some embodiments, the differential interface circuit further includes control logic, configured to select the predefined initialization value from among multiple predefined initialization values depending on a communication mode of the differential interface circuit. In an example embodiment, the communication mode corresponds to an operational mode of a memory device.

In an embodiment, the feedback initialization circuit is configured to stop overriding the common-mode feedback circuit in response to detecting that the differential input signal is no longer in the range predefined as abnormal. In an embodiment, a memory device includes the disclosed differential interface circuit.

There is additionally provided, in accordance with an embodiment that is described herein, a method for receiving a differential input signal. The method includes amplifying the differential input signal by a differential amplifier circuit, so as to produce an amplified differential output signal. A common-mode level of the differential output signal is estimated, a feedback value is produced in response to the estimated common-mode level, and the differential amplifier circuit is adjusted using the feedback value. In response to detecting that the differential input signal is in a range predefined as abnormal, the adjustment of the differential amplifier circuit using the feedback value is temporarily overridden, and the feedback value applied to the differential amplifier circuit is instead set to a predefined initialization value.

The present disclosure will be more fully understood from the following detailed description of the embodiments thereof, taken together with the drawings in which:

BRIEF DESCRIPTION OF THE DRAWINGS

FIGS. 2-4 are circuit diagrams that schematically illustrates elements of the differential interface circuit of FIG. 1, in accordance with an embodiment that is described herein.

DETAILED DESCRIPTION OF EMBODIMENTS

Figure 1:
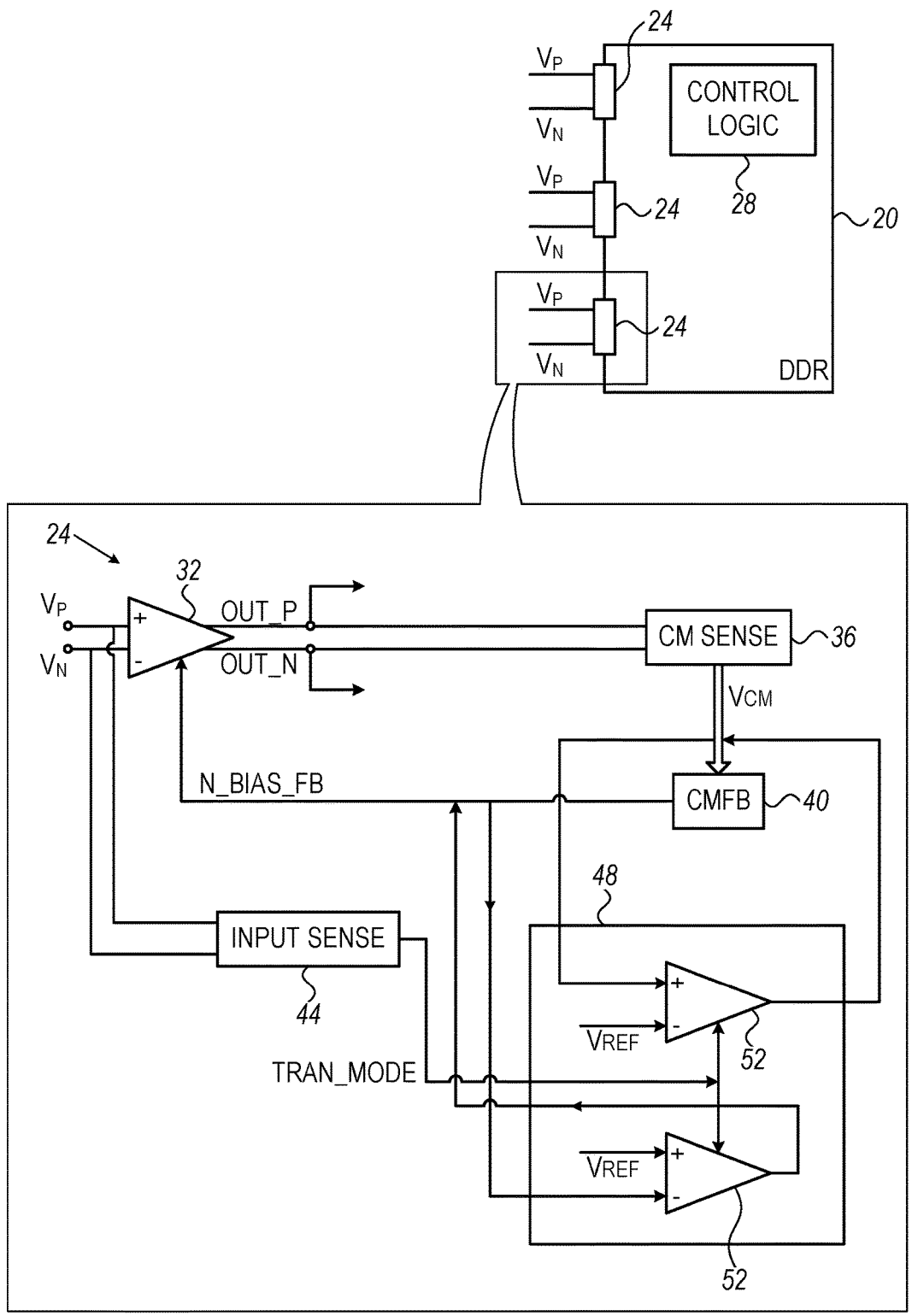
FIG. 1 is a block diagram that schematically illustrates a differential interface circuit used in a Dual Data Rate (DDR) memory device, in accordance with an embodiment that is described herein.

Embodiments that are described herein provide differential interface circuits having improved Common-Mode (CM) feedback, and associated methods. The embodiments described herein refer mainly to differential interface circuits used in Input-Output (I/O) buses of Double Data Rate Synchronous Dynamic Random Access Memory (DDR SDRAM) devices. The disclosed techniques, however, are not limited to such devices, and are useful for implementing differential interface circuits in various other suitable electronic devices.

In some embodiments, a differential interface circuit comprises a differential amplifier circuit, which receives and amplifies a differential input signal, so as to produce a differential output signal. The differential input signal comprises two sub-signals denoted $[V_P, V_N]$, and the differential output signal comprises two sub-signals denoted $[OUT\_P, OUT\_N]$.

The differential interface circuit further comprises a Common-Mode (CM) feedback circuit. In the present context, the common-mode level of a differential signal is defined as the arithmetic mean of the two sub-signals of the differential signal. The CM feedback circuit estimates the common-mode level of the differential output signal $[OUT\_P, OUT\_N]$, generates an analog feedback value denoted $N\_BIAS\_FB$ in response to the estimated common-mode level, and adjusts one or more parameters of the differential amplifier circuit (e.g., bias voltage) based on the feedback value.

In some practical use-cases, a valid differential input signal is available at the input of the differential interface circuit only intermittently. Once available, however, the differential interface circuit is required to start outputting a correct differential output signal within a very short time period. In DDR memory devices, for example, memory-access transactions tend to be highly intermittent, and the address and data buses are idle most of the time. When a transaction begins on the address and data buses, however, the differential interface circuits are required to resume reliable operation within a single Unit Interval (UI—the time between successive state changes, also referred to as symbol interval).

Such an intermittent pattern of the differential input signal is detrimental to the performance of the CM feedback circuit. In a practical scenario, when a transaction is not in progress, the differential input signal [$V_P$,$V_N$] may drift, and $V_P$ and $V_N$ may reach any value between zero and the supply voltage. Re-convergence of the CM feedback circuit from such abnormal values can take a long time. In one example, the re-convergence time is particularly long when one or both sub-signals ($V_P$ and/or $V_N$) are lower than the threshold voltages ($V_T$) of the corresponding amplification transistors in the differential amplifier circuit.

In some embodiments that are described herein, the differential interface circuit further comprises a feedback initialization circuit, which mitigates the above-described drawback of the CM feedback circuit. The feedback initialization circuit is configured to detect that the differential input signal is in an abnormal range (e.g., detect that $V_P$ and/or $V_N$ are lower than the threshold voltages of the corresponding amplification transistors).

In response to detecting this situation, the feedback initialization circuit is configured to temporarily override the CM feedback circuit, and instead set the feedback value N_BIAS_FB to a predefined initialization value. In some embodiments the feedback initialization circuit also overrides the estimate of the common-mode level of the differential output signal [OUT_P,OUT_N], and replaces it with some predefined initialization value.

When using the disclosed overriding technique, the differential amplifier circuit is provided with a predefined initialization value for N_BIAS_FB, instead of the actual unpredictable value of N_BIAS_FB, as long as the differential input signal is in the abnormal range. In some embodiments, the estimate of the common-mode level of the differential output signal is also constrained to a predefined initialization value instead of the actual unpredictable value. Therefore, once the differential input signal exits the abnormal range (e.g., $V_P$ and/or $V_N$ exceed the threshold voltages of the corresponding amplification transistors), the CM feedback loop re-converges rapidly.

The description that follows begins with a system-level description of an example embodiment of the disclosed differential interface circuit. Detailed circuit diagrams of the various building blocks of the differential interface circuit are provided further below.

FIG. 1 is a block diagram that schematically illustrates a memory device 20, which comprises multiple differential interface circuits 24, in accordance with an embodiment that is described herein. In the present example memory device 20 comprises a Dual Data Rate Synchronous Dynamic Random Access Memory device (DDR SDRAM, or DDR for brevity). Alternatively, however, the differential interface circuits described herein are applicable in other suitable types of memory devices, and in other suitable electronic devices in general.

In the embodiment of FIG. 1, memory device 20 comprises multiple differential Input-Output (I/O) pads, each comprising a respective differential interface circuit 24. The I/O pads are used, for example, as part of a data bus or address bus that connects memory device 20 with a host. Memory device 20 further comprises control logic 28 that configures and controls differential interface circuits 24.

The disclosed techniques are mainly concerned with reception of differential signals, and therefore the figures and description focus on the reception (input) aspects of differential interface circuit 24. Typically, however, the I/O pads of memory device 20 are bidirectional, and differential interface circuit 24 further comprises circuitry (not shown) that transmits differential signals. The disclosed techniques are nevertheless also applicable to input pads that perform signal reception only.

An inset at the bottom of FIG. 1 shows the internal structure of differential interface circuit 24, in an embodiment. Differential interface circuit 24 receives as input a differential input signal, which comprises two sub-signals denoted $V_P$ and $V_N$. (This notation is merely a naming convention and does not necessarily imply that one sub-signal is positive and the other is negative.)

Differential interface circuit 24 comprises a differential amplifier circuit 32, which is configured to receive and amplify the differential input signal [$V_P$,$V_N$], so as to produce a differential output signal comprising two sub-signals denoted [OUT_P,OUT_N]. A detailed circuit diagram of differential amplifier circuit 32, in an embodiment, is shown in FIG. 2 below. The differential output signal produced by differential amplifier circuit 32 is provided as the output [OUT_P,OUT_N] of differential interface circuit 24.

Differential interface circuit 24 supports one or more DDR modes, for example $3^{rd}$-generation DDR (DDR3), $4^{th}$-generation DDR (DDR4) and/or Low-Power DDR4 (LPDDR4). The LPDDR4 mode also has two sub-modes, with and without a termination resistor. In various embodiments, differential interface circuit 24 supports various subsets of these modes. When more than one mode is supported, control logic 28 typically configures differential interface circuit 24 with the currently applicable DDR mode. The DDR modes are also referred to herein as communication modes. The modes for DDR4, for example, are specified in Chapter 4 of JEDEC Standard JESD79-4A, entitled "DDR4 SDRAM," November, 2013, which is incorporated herein by reference.

Each of the DDR modes described above specifies a range of voltage levels (amplitudes) of $V_P$ and $V_N$ that is considered valid, as well as a Common-Mode (CM) voltage range considered valid. In the present context, the term "common-mode voltage" means the average of $V_P$ and $V_N$, i.e., ($V_P$+$V_N$)/2. The different DDR modes typically differ from one another in the valid voltage levels of $V_P$ and $V_N$ and in the valid common-mode voltage range. Moreover, even for the same DDR mode, in some embodiments the common-mode voltage varies as a function of the supply voltage (denoted VDDO). In DDR4, for example, the common-mode voltage level is specified as ~70% of VDDO, but VDDO itself is permitted to vary between 1.13V and 1.3V.

In some embodiments, differential interface circuit 24 comprises a Common-Mode (CM) feedback circuit, which measures the CM voltage at the output of differential amplifier circuit 32, and adjusts one or more parameters (e.g., transistor bias voltages) in differential amplifier circuit 32 based on the measured CM voltage. Typically, the CM feedback circuit attempts to retain the actual CM voltage constant and within its specified range, and to retain the amplification transistors in differential amplifier circuit 32 at their correct operating points.

In the present example, the CM feedback circuit comprises a CM sense module 36 and a feedback generation (CMFB) module 40. CM sense module 36 measures the actual analog common mode voltage (denoted $V_{CM}$, and also referred to as "common mode level") in the differential output signal [OUT_P,OUT_N]. Based on the measured $V_{CM}$, CMFB module 40 generates a feedback voltage (denoted N_BIAS_FB and also referred to as "feedback value") and provides N_BIAS_FB to differential amplifier circuit 32. Detailed circuit diagrams of CM sense module and CMFB module 40, including measurement of $V_{CM}$, generation of N_BIAS_FB and biasing of amplifier circuit 32 based on N_BIAS_FB, are shown in FIGS. 2 and 3 below.

In practice, the CM feedback scheme described above performs well under steady-state conditions, i.e., when the differential input signal $[V_P,V_N]$ at the input to differential interface circuit 24 is continuously present and valid. If, however, the differential input signal deviates from its valid range, e.g. when no transaction is in progress, $V_{CM}$ and N_BIAS_FB will most likely drift away from their desired values. When the differential input signal becomes valid again, CM sense module 36 and CMFB module 40 might require a relatively long time to re-converge to the appropriate $V_{CM}$ and N_BIAS_FB values.

The dependence of the CM feedback loop on the continuous presence of a valid differential input signal is problematic in some practical implementations and use-cases. Consider, for example, the use of differential interface circuit 24 in an address or data bus of a DDR memory device, as illustrated in FIG. 1. In DDR memory devices, memory-access transactions are performed intermittently. Most of the time, the buses between the host and the memory device are idle. During such idle periods, there is no guarantee as to the voltage levels $[V_P,V_N]$ of the differential input signal. Generally, $V_P$ and $V_N$ may each drift to any voltage between zero and the supply voltage VDDO.

Nevertheless, differential interface circuit 24 is typically required to receive and amplify the differential input signal reliably within one Unit Interval (UI) from the beginning of a transaction. For a DDR device operating with a 2.4 GHz clock signal, differential interface circuit 24 is required to re-converge within 1/2.4 GHz≈0.41 nS from the beginning of a new transaction.

In the embodiments described herein, differential interface circuit 24 comprises a feedback initialization circuit, which is configured to mitigate the above-described dependence of the CM feedback loop on the continuous presence of a valid differential input signal. The feedback initialization circuit is configured to temporarily override the CM feedback circuit when the differential input signal $[V_P,V_N]$ is found to be in a predefined abnormal range (e.g., when both $V_P$ and $V_N$ are lower than the threshold voltages of the corresponding amplification transistors in differential amplifier circuit 32).

Figure 4:
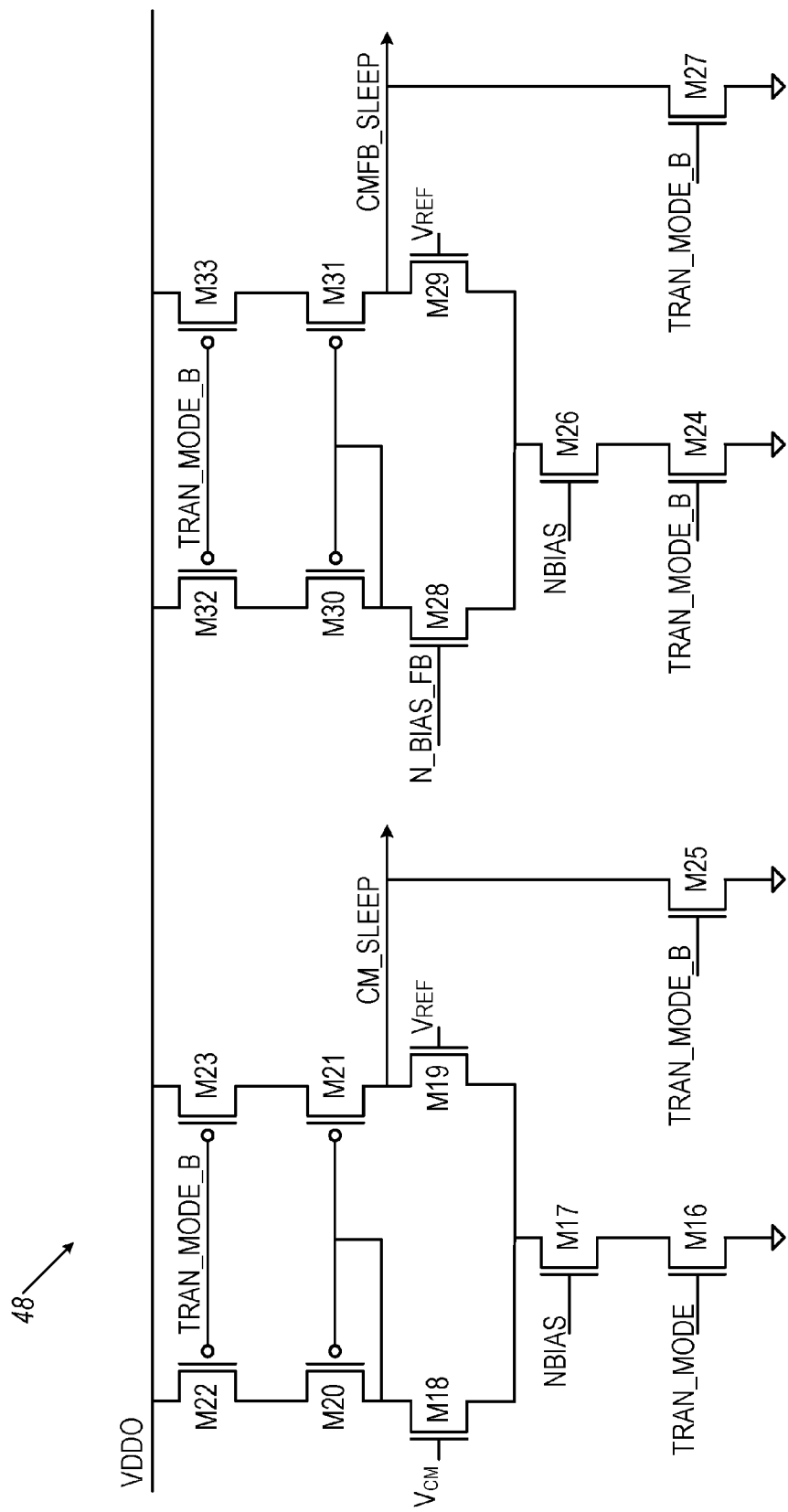

When overriding the CM feedback circuit, the feedback initialization circuit disregards the output of CMFB module 40, and instead sets N_BIAS_FB to a respective predefined analog initialization value. In some embodiments, the feedback initialization circuit also disregards the output of CM sense module 36, and instead sets $V_{CM}$ to a respective predefined analog initialization value. Detection that the differential input signal is in the predefined abnormal range is shown in FIG. 2 below. FIG. 4 below shows how the predefined initialization values of N_BIAS_FB and $V_{CM}$ are set and produced.

The predefined initialization values of N_BIAS_FB and $V_{CM}$ are typically chosen to be close to the expected values of _BIAS_FB and $V_{CM}$ under steady-state conditions. For example, in some embodiments the predefined initialization value is chosen to be approximately VDDO/2, a value from which the CM feedback circuit is able to re-converge rapidly. This sort of overriding means that (i) differential amplifier circuit is provided with the predefined initialization value of N_BIAS_FB as long as the differential input signal is abnormal, and (ii) once the differential input signal becomes valid again, the CM feedback loop re-converges rapidly.

Typically, the "abnormal range" of the differential input signal, which warrants overriding the CM feedback loop, is chosen to be a range from which the CM feedback loop takes an excessively long time to recover. In the embodiments described herein, the differential input signal $[V_P,V_N]$ is regarded as "in the abnormal range" if both sub-signals $V_P$ and $V_N$ are lower than the threshold voltages $(V_T)$ of the respective amplification transistors that amplify them in differential amplifier circuit 32. If at least one of the sub-signals $V_P$ and $V_N$ is higher than the threshold voltage of its respective amplification transistor, the differential input signal is not regarded as being "in the abnormal range." In alternative embodiments, any other suitable definition of the predefined abnormal range can be used.

In the embodiment of FIG. 1, the feedback initialization circuit comprises an input sense module 44 and a feedback override module 48. Input sense module 44 senses the differential input signal $[V_P,V_N]$, and asserts a signal denoted TRAN_MODE that indicates whether the differential input signal is in the predefined abnormal range. Feedback override module 48 is enabled by the TRAN_MODE signal. When enabled by the TRAN_MODE signal, feedback override module 48 forces the voltage at the output of CM sense module 36 to the predefined initialization value of $V_{CM}$, and forces the voltage at the output of CMFB module 40 to the predefined initialization value of N_BIAS_FB.

When the differential input signal $[V_P,V_N]$ exits the predefined abnormal range, input sense module 44 de-asserts the TRAN_MODE signal. In response to the de-assertion of TRAN_MODE, feedback override module stops overriding the CM feedback loop. From this point, the values of $V_{CM}$ and N_BIAS_FB are again determined adaptively by CM sense module 36 and CMFB module 40, respectively.

In the example of FIG. 1, feedback override module 48 comprises two feedback loops, each based on a respective amplifier 52. When enabled by the TRAN_MODE signal, the two feedback loops set the predefined values of $V_{CM}$ and N_BIAS_FB to match respective reference voltages denoted $V_{REF}$. Derivation of $V_{REF}$ from the supply voltage VDDO, in an embodiment, is shown in FIG. 3 below. In an embodiment, control logic 28 configures the values of these reference voltages in accordance with the applicable DDR mode. Detailed circuit diagrams of input sense module 44 and feedback override module 48 are shown in FIGS. 2 and 4 below, respectively.

Unlike the CM feedback circuit (CM sense module 36 and CMFB module 40), input sense module 44 has a very fast response in generating the TRAN_MODE signal, e.g., on the order of tens of picoseconds. Input sense module 44 is therefore able to switch-off the overriding of the CM feedback circuit immediately when a transaction begins, and to switch-on the overriding when no transaction is in progress and the differential input signal drifts back to the abnormal range.

In the DDR example of FIG. 1, the CM feedback loop re-converges in less than one UI from the beginning of a transaction. U.S. Provisional Patent Application 62/290,019, cited above and incorporated by reference in its entirety, provides example simulation results that demonstrate this performance.

FIG. 2 is a circuit diagram of differential amplifier circuit 32, CM sense module 36 and input sense module 44, in accordance with an embodiment that is described herein.

The right-hand side of FIG. 2 shows the design of differential amplifier circuit 32 and CM sense module 36. In the present example, differential amplifier circuit 32 comprises five transistors denoted M1, M2, M3, M4 and M5. Transistors M1 and M2 comprise Negative-type Metal Oxide Semiconductor (N-MOS) Field-Effect Transistors (FETs), and are referred to as the amplification transistors or input transistors of differential amplifier circuit 32, in an embodiment. The sub-signals $V_P$ and $V_N$ of the differential input signal are provided to the gates of M1 and M2, and are amplified by the respective transistors.

Transistors M3 are Positive-type MOS (P-MOS) FETs, and function as output transistors that output the sub-signals OUT_P and OUT_N of the differential output signal, respectively. The gates of M3 and M4 are biased by a voltage denoted $V_{BP}$, which is fixed at VDDO/4 by a resistive voltage divider (shown in FIG. 3 below), in an embodiment. This bias voltage ensures that M3 and M4 are biased in strong inversion.

Transistor M5 comprises an N-MOS FET, which biases the differential pair M1-M4 with the bias voltage N_BIAS_FB. As explained above, at some points in time N_BIAS_FB is adaptive as part of the CM feedback loop, while at other times N_BIAS_FB is forced to a predefined initialization value by feedback override module 48.

In the embodiment of FIG. 2, CM sense module 36 is implemented using a pair of resistors $R_1$ and $R_2$, in the present example having the same resistance. The resulting common-mode voltage $V_{CM}$ is provided to CMFB module 40 (see FIG. 1).

The left-hand side of FIG. 2 shows the design of input sense module 44. In the present example, input sense module 44 comprises a pair of N-MOS FETs denoted M6 and M7. Transistors M6 and M7 (which are referred to herein as reference transistors) have similar characteristics and operating points to transistors M1 and M2 (referred to above as amplification transistors or input transistors) of differential amplifier circuit 32, respectively. For example, M6 is designed to have a similar threshold voltage to M1, and M7 is designed to have a similar threshold voltage to M2. Like transistors M1 and M2, transistors M6 and M7 are provided with sub-signals $V_P$ and $V_N$ of the differential input signal at their gates, respectively.

The Role of transistors M6 and M7 is to assert the signal TRAN_MODE if (and only if) both $V_P$ and $V_N$ drop below the respective threshold voltages ($V_T$) of M6 and M7. As long as $V_P$ and/or $V_N$ are above the respective $V_T$, a current path is open from VDDO through transistor M8 and the pair M6-M7 to ground, and therefore TRAN_MODE is not asserted. Only when both $V_P$ and $V_N$ drop below the respective $V_T$, both transistors are in cutoff, and the TRAN_MODE node becomes high.

Due to the similarity between the pair M6-M7 and the pair M1-M2, TRAN_MODE is asserted if (and only if) both $V_P$ and $V_N$ drop below the respective threshold voltages of M1 and M2. As discussed above, this condition indicates the abnormal range of the differential input signal, which activates feedback override module 48. The signal TRAN_MODE, and its complement denoted TRAN_MODE_B, are distributed to various points in differential interface circuit 24, as will be shown in the following figures.

A current source denoted $I_{REF}$, on the left-hand side of the figure, supplies an accurate reference current. The circuit comprising N-MOS FETs MB1, MB2 and MB3 uses this reference current for generating two bias voltages denoted NBIAS and PBIAS. Bias voltage NBIAS is used for (i) biasing the current-sources of respective differential amplifiers through transistors M12, M17 and M26 (see FIGS. 3 and 4 below), and (ii) mirroring the reference current generated by the current source $I_{REF}$, to generate the PBIAS voltage. Bias voltage PBIAS mirrors the reference current of $I_{REF}$ for generating the TRAN_MODE signal.

An N-MOS FET denoted M9 is used for disabling $V_{CM}$ while feedback override module 48 is active (while the differential input signal is in the abnormal range). M9 is switched on and off by a signal denoted CM_SLEEP, which is asserted when feedback override module is active and de-asserted otherwise. CM_SLEEP is generated in feedback override module 48 (see FIG. 4 below).

FIG. 3 is a circuit diagram of CMFB module 40, in accordance with an embodiment that is described herein. In the present example, CMFB module 40 comprises three N-MOS FETs denoted M10, M11 and M12, and two P-MOS FETs denoted M13 and M14. CMFB module 40 receives as input a reference voltage denoted $V_{REF}$, which is produced by a resistive voltage divider comprising resistors denoted $R_3$ and $R_4$. $R_3$ and $R_4$ have the same resistance, and therefore reference voltage $V_{REF}$ is set to VDDO/2. CMFB module 40 compares $V_{REF}$ with $V_{CM}$ (received from CM sense module 36—see FIGS. 1 and 2).

The resulting voltage difference between $V_{REF}$ and $V_{CM}$ is output as N_BIAS_FB (the feedback value that is fed back to differential amplifier circuit 32). In other words, the feedback value N_BIAS_FB is generated as the difference between $V_{CM}$ (the actual measured common-mode level of the differential output signal [OUT_P,OUT_N]) and VDDO/2 (the desired target level for the common-mode level, to be retained while the differential input signal is in the abnormal range).

Another N-MOS FET denoted M15 is used for fixing the value of N_BIAS_FB at approximately VDDO/2 while feedback override module 48 is active (while the differential input signal is in the abnormal range). M15 is switched on and off by a signal denoted CMFB_SLEEP, which is asserted when feedback override module 48 is active and de-asserted otherwise. CMFB_SLEEP is generated in feedback override module 48 (see FIG. 4 below).

In an embodiment, M5 comprises a core device, which is used for reducing the capacitance at its drain. The reduced capacitance helps improve the common-mode rejection ratio of CMFB module 40, and increases the bandwidth of the CM feedback loop. For the same reason, the supply voltage of this circuit is VDD, which is lower than VDDO, so as to avoid stress at the gate of M5.

The right-hand side of the figure shows another resistive voltage divider, which comprises four equal-resistance resistors denoted $R_5$, $R_6$, $R_7$ and $R_8$. This voltage divider fixes voltage $V_{BP}$ at VDDO/4. This voltage is applied to the gates of M3 and M4, as explained above with respect to FIG. 2.

FIG. 4 is a circuit diagram of feedback override module 48, in accordance with an embodiment that is described herein. In the present example, feedback override module 48 comprises a first amplifier (comprising transistors denoted M17, M18, M19, M20, M21, M22 and M23) and a second amplifier (comprising transistors denoted M24, M26, M28, M29, M30, M31, M32 and M33). The first and second amplifiers correspond to amplifiers 52 shown in FIG. 1. Both amplifiers are enabled and disabled using the TRAN_MODE and TRAN_MODE_B signals described above (which control transistors M16, M25, M24 and M27).

When enabled, the first amplifier (on the left-hand side of the figure) ensures that $V_{CM}$ approximately matches $V_{REF}$, by generating the CM_SLEEP signal provided to the gate of M9 (FIG. 2). The second amplifier (on the right-hand side of the figure), when enabled, ensures that N_BIAS_FB approximately matches $V_{REF}$, by generating the CMFB_SLEEP signal provided to the gate of M15 (FIG. 3).

Transistors M25 and M27 connect the CM_SLEEP and CMFB_SLEEP nodes to ground when TRAN_MODE_B is asserted (while feedback override module 48 is disabled). As a result, transistors M9 (FIG. 2) and M15 (FIG. 3) are in cutoff while feedback override module 48 is disabled, and do not interfere with the normal operation of the CM feedback circuit.

The configurations of memory device 20, differential interface circuit 24, and the various elements of differential interface circuit 24, such as differential amplifier circuit 32, CM sense module 36, CMFB module 40, input sense module 44 and FB overrise module 48, shown in FIGS. 1-4 herein, are example configurations that are depicted solely for the sake of clarity. In alternative embodiments, any other suitable configurations can be used. Circuit elements that are not mandatory for understanding of the disclosed techniques have been omitted from the figures for the sake of clarity.

The different elements of memory device 20, differential interface circuit 24, and the various elements of differential interface circuit 24, may be implemented using dedicated hardware or firmware, such as using hard-wired or programmable logic, e.g., in an Application-Specific Integrated Circuit (ASICs) or Field-Programmable Gate Array (FPGA). Some elements of memory device 20, for example control logic 28, may be implemented using software, or using a combination of hardware, software and/or firmware elements.

Although the embodiments described herein mainly address DDR memory devices, the methods and systems described herein can also be used in other electronic devices and applications, e.g., in other differential interfaces that receive intermittent input signals but are nevertheless required to have fast set-up time.

It is noted that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A differential interface circuit, comprising:
   a differential amplifier circuit, configured to receive and amplify a differential input signal so as to produce an amplified differential output signal;
   a common-mode feedback circuit, configured to estimate a common-mode level of the differential output signal, to produce a feedback value in response to the estimated common-mode level, and to adjust the differential amplifier circuit using the feedback value; and
   a feedback initialization circuit, which is configured, in response to detecting that the differential input signal is in a range predefined as abnormal, to temporarily override the common-mode feedback circuit, and instead set the feedback value applied to the differential amplifier circuit to a predefined initialization value.

2. The differential interface circuit according to claim 1, wherein the feedback initialization circuit is configured to override the common-mode feedback circuit in response to detecting that both sub-signals of the differential input signal are lower than threshold voltages of respective amplification transistors of the differential amplifier circuit.

3. The differential interface circuit according to claim 2, wherein the feedback initialization circuit comprises at least two reference transistors having threshold voltages that match the threshold voltages of the input transistors of the differential amplifier circuit, and wherein the feedback initialization circuit is configured to detect the range predefined as abnormal by comparing the sub-signals of the differential input signal to the threshold voltages of the reference transistors.

4. The differential interface circuit according to claim 1, wherein the feedback initialization circuit is configured to temporarily override the common-mode feedback circuit by setting (i) an estimate of the common-mode level and (ii) the feedback signal to respective initialization values.

5. The differential interface circuit according to claim 1, further comprising control logic, configured to select the predefined initialization value from among multiple predefined initialization values depending on a communication mode of the differential interface circuit.

6. The differential interface circuit according to claim 5, wherein the communication mode corresponds to an operational mode of a memory device.

7. The differential interface circuit according to claim 1, wherein the feedback initialization circuit is configured to stop overriding the common-mode feedback circuit in response to detecting that the differential input signal is no longer in the range predefined as abnormal.

8. A memory device comprising the differential interface circuit of claim 1.

9. A method for receiving a differential input signal, the method comprising:
   amplifying the differential input signal by a differential amplifier circuit, so as to produce an amplified differential output signal;
   estimating a common-mode level of the differential output signal, producing a feedback value in response to the estimated common-mode level, and adjusting the differential amplifier circuit using the feedback value; and
   in response to detecting that the differential input signal is in a range predefined as abnormal, temporarily overriding adjustment of the differential amplifier circuit using the feedback value, and instead setting the feedback value applied to the differential amplifier circuit to a predefined initialization value.

10. The method according to claim 9, wherein detecting that the differential input signal is in the range predefined as abnormal range comprises detecting that both sub-signals of the differential input signal are lower than threshold voltages of respective amplification transistors of the differential amplifier circuit.

11. The method according to claim 10, wherein detecting that the sub-signals are lower than the threshold voltages of the amplification transistors comprises comparing the sub-signals of the differential input signal to threshold voltages of at least two reference transistors, the reference transistors having threshold voltages that match the threshold voltages of the input transistors of the differential amplifier circuit.

12. The method according to claim 9, wherein temporarily overriding the common-mode feedback circuit comprises setting (i) an estimate of the common-mode level and (ii) the feedback signal to respective initialization values.

13. The method according to claim 9, further comprising selecting the predefined initialization value from among multiple predefined initialization values depending on a currently applied communication mode.

14. The method according to claim 12, wherein the communication mode corresponds to an operational mode of a memory device.

15. The method according to claim 9, comprising stopping the overriding in response to detecting that the differential input signal is no longer in the range predefined as abnormal.

* * * * *